(12) United States Patent
Wang et al.

(10) Patent No.: US 12,464,956 B2
(45) Date of Patent: Nov. 4, 2025

(54) MAGNETIC RANDOM ACCESS MEMORY STRUCTURE AND FABRICATION METHOD THEREOF

(71) Applicant: UNITED MICROELECTRONICS CORP., Hsin-Chu (TW)

(72) Inventors: Hui-Lin Wang, Taipei (TW); Che-Wei Chang, Taichung (TW); Ching-Hua Hsu, Kaohsiung (TW); Chen-Yi Weng, New Taipei (TW); Po-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 396 days.

(21) Appl. No.: 18/122,165

(22) Filed: Mar. 16, 2023

(65) Prior Publication Data

US 2024/0298547 A1 Sep. 5, 2024

(30) Foreign Application Priority Data

Mar. 3, 2023 (TW) ................................. 112107826

(51) Int. Cl.
*H10N 50/10* (2023.01)
*H01L 23/522* (2006.01)
*H01L 23/528* (2006.01)
*H10B 61/00* (2023.01)
*H10N 50/80* (2023.01)

(52) U.S. Cl.
CPC .......... *H10N 50/10* (2023.02); *H01L 23/5226* (2013.01); *H01L 23/5283* (2013.01); *H10B 61/00* (2023.02); *H10N 50/80* (2023.02)

(58) Field of Classification Search
CPC ........ H10N 50/10; H10N 50/80; H10B 61/00; H01L 23/5226; H01L 23/5283
USPC .......................................................... 257/288
See application file for complete search history.

(56) References Cited

U.S. PATENT DOCUMENTS

| | | | |
|---|---|---|---|
| 9,230,626 B2 | 1/2016 | Buhrman | |
| 10,270,025 B2* | 4/2019 | Chuang | H10B 61/22 |
| 10,825,499 B2* | 11/2020 | Chuang | H10N 50/85 |
| 12,089,508 B2* | 9/2024 | Lin | H10N 50/10 |
| 2020/0058752 A1* | 2/2020 | Tyagi | G01N 27/414 |
| 2020/0343301 A1* | 10/2020 | Buford | H10N 50/01 |

(Continued)

OTHER PUBLICATIONS

Hong, S. et al. Ultralow-dielectric-constant amorphous boron nitride. Nature 582, 511-514 (2020). https://doi.org/10.1038/s41586-020-2375-9) (Year: 2020).*

(Continued)

*Primary Examiner* — Jami Valentine Miller
(74) *Attorney, Agent, or Firm* — Winston Hsu

(57) ABSTRACT

A magnetic random access memory structure includes a first dielectric layer, a bottom electrode layer disposed on the first dielectric layer; a spin orbit coupling layer disposed on the bottom electrode layer; a magnetic tunneling junction (MTJ) element disposed on the spin orbit coupling layer; a top electrode layer disposed on the MTJ element; a protective layer surrounding the MTJ element and the top electrode layer, and the protective layer masking the spin orbit coupling layer; a mask layer surrounding the protective layer, and a spacer layer surrounding the mask layer and the protective layer.

18 Claims, 14 Drawing Sheets

(56) References Cited

U.S. PATENT DOCUMENTS

2023/0027792 A1\* 1/2023 Chiu .................. G11C 11/1655
2024/0306514 A1\* 9/2024 Wang .................... H10B 61/00

OTHER PUBLICATIONS

Tanaka et al. Film Properties of Low-k Silicon Nitride Films Formed by Hexachlorodisilane and Ammonia. 2000 J. Electrochem. Soc. 147 2284 DOI 10.1149/1.1393522 (Year: 2000).\*

\* cited by examiner

MAGNETIC RANDOM ACCESS MEMORY STRUCTURE AND FABRICATION METHOD THEREOF

BACKGROUND OF THE INVENTION

1. Field of the Invention

The invention relates to the field of semiconductor technology, in particular to an improved magnetic random access memory (MRAM) structure and a manufacturing method thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

It is one object of the present invention to provide an improved magnetic random access memory structure in order to solve the deficiencies or shortcomings of the prior art.

One aspect of the invention provides a magnetic random access memory structure including a substrate; a first dielectric layer disposed on the substrate; a first conductive via and a second conductive via in proximity to the first conductive via embedded in the first dielectric layer; and a bottom electrode layer disposed on the first dielectric layer. The bottom electrode layer electrically connects the first conductive via with the second conductive via. A spin orbit coupling layer is disposed on the bottom electrode layer. A magnetic tunneling junction (MTJ) element is disposed on the spin orbit coupling layer. A top electrode layer is disposed on the MTJ element. A nitride protective layer is disposed to surround the MTJ element and the top electrode layer. The nitride protective layer masks the spin orbit coupling layer. An oxide mask layer is disposed to surround the nitride protective layer. A nitride spacer layer is disposed to surround the oxide mask layer and the nitride protective layer.

According to some embodiments, the MTJ element comprises a free layer in direct contact with the spin orbit coupling layer, a tunnel barrier layer on the free layer, and a reference layer on the tunnel barrier layer.

According to some embodiments, the MTJ clement further comprises a cap layer on the reference layer, wherein the top electrode layer is disposed on the cap layer.

According to some embodiments, the oxide mask layer between the nitride protective layer and the nitride spacer layer has a first thickness in a first direction and a second thickness in a second direction, wherein the first thickness is different from the second thickness.

According to some embodiments, the nitride protective layer comprises silicon nitride, the oxide mask layer comprises silicon oxide, and the nitride spacer layer comprises silicon nitride.

According to some embodiments, the nitride spacer layer is in direct contact with a peripheral sidewall of the nitride protective layer, a peripheral sidewall of the spin orbit coupling layer, and a peripheral sidewall of the bottom electrode layer.

According to some embodiments, the nitride spacer layer is in direct contact with the first dielectric layer.

According to some embodiments, the magnetic random access memory structure further comprises a second dielectric layer surrounding the nitride spacer layer.

According to some embodiments, a top surface of the second dielectric layer is coplanar with a top surface of the nitride spacer layer, a top surface of the oxide mask layer, a top surface of the nitride protective layer, and a top surface of the top electrode layer.

According to some embodiments, the spin orbit coupling layer comprises a tungsten layer.

Another aspect of the invention provides a magnetic random access memory structure including a first dielectric layer; a bottom electrode layer disposed on the first dielectric layer; a spin orbit coupling layer disposed on the bottom electrode layer; a magnetic tunneling junction (MTJ) element disposed on the spin orbit coupling layer; a top electrode layer disposed on the MTJ element; a protective layer surrounding the MTJ element and the top electrode layer, and the protective layer masking the spin orbit coupling layer; a mask layer surrounding the protective layer; and a spacer layer surrounding the mask layer and the protective layer.

According to some embodiments, the MTJ element comprises a free layer in direct contact with the spin orbit coupling layer, a tunnel barrier layer on the free layer, and a reference layer on the tunnel barrier layer.

According to some embodiments, the MTJ element further comprises a cap layer on the reference layer, wherein the top electrode layer is disposed on the cap layer.

According to some embodiments, the mask layer between the protective layer and the spacer layer has a first thickness in a first direction and a second thickness in a second direction, wherein the first thickness is different from the second thickness.

According to some embodiments, the protective layer comprises silicon nitride, the mask layer comprises silicon oxide, and the spacer layer comprises silicon nitride.

According to some embodiments, the spacer layer is in direct contact with a peripheral sidewall of the protective layer, a peripheral sidewall of the spin orbit coupling layer, and a peripheral sidewall of the bottom electrode layer.

According to some embodiments, the spacer layer is in direct contact with the first dielectric layer.

According to some embodiments, the magnetic random access memory structure further comprises a second dielectric layer surrounding the spacer layer.

According to some embodiments, a top surface of the second dielectric layer is coplanar with a top surface of the spacer layer, a top surface of the mask layer, a top surface of the protective layer, and a top surface of the top electrode layer.

According to some embodiments, the spin orbit coupling layer comprises a tungsten layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
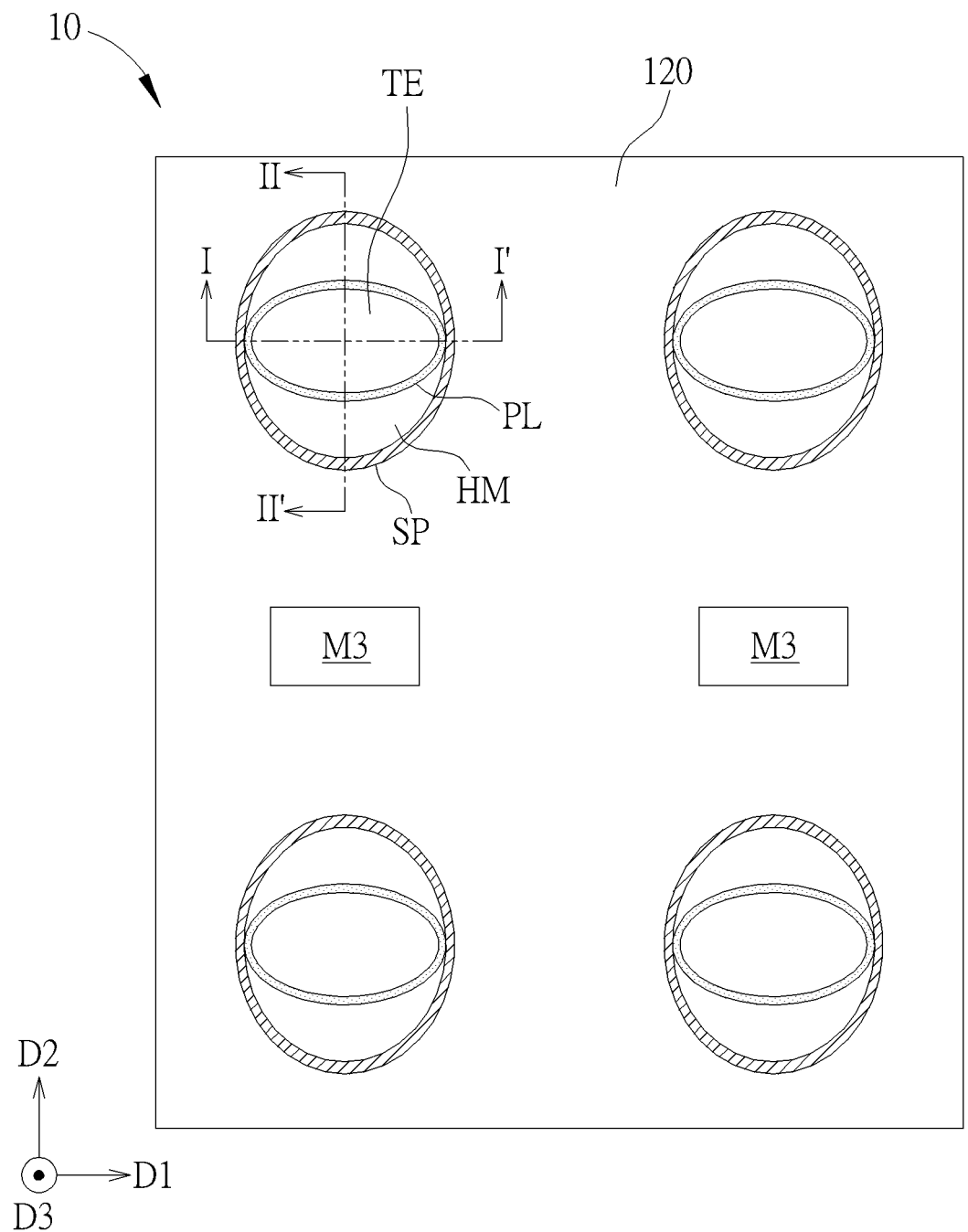
FIG. 1 is a top view of a magnetic random access memory structure according to an embodiment of the present invention.
Figure 2:
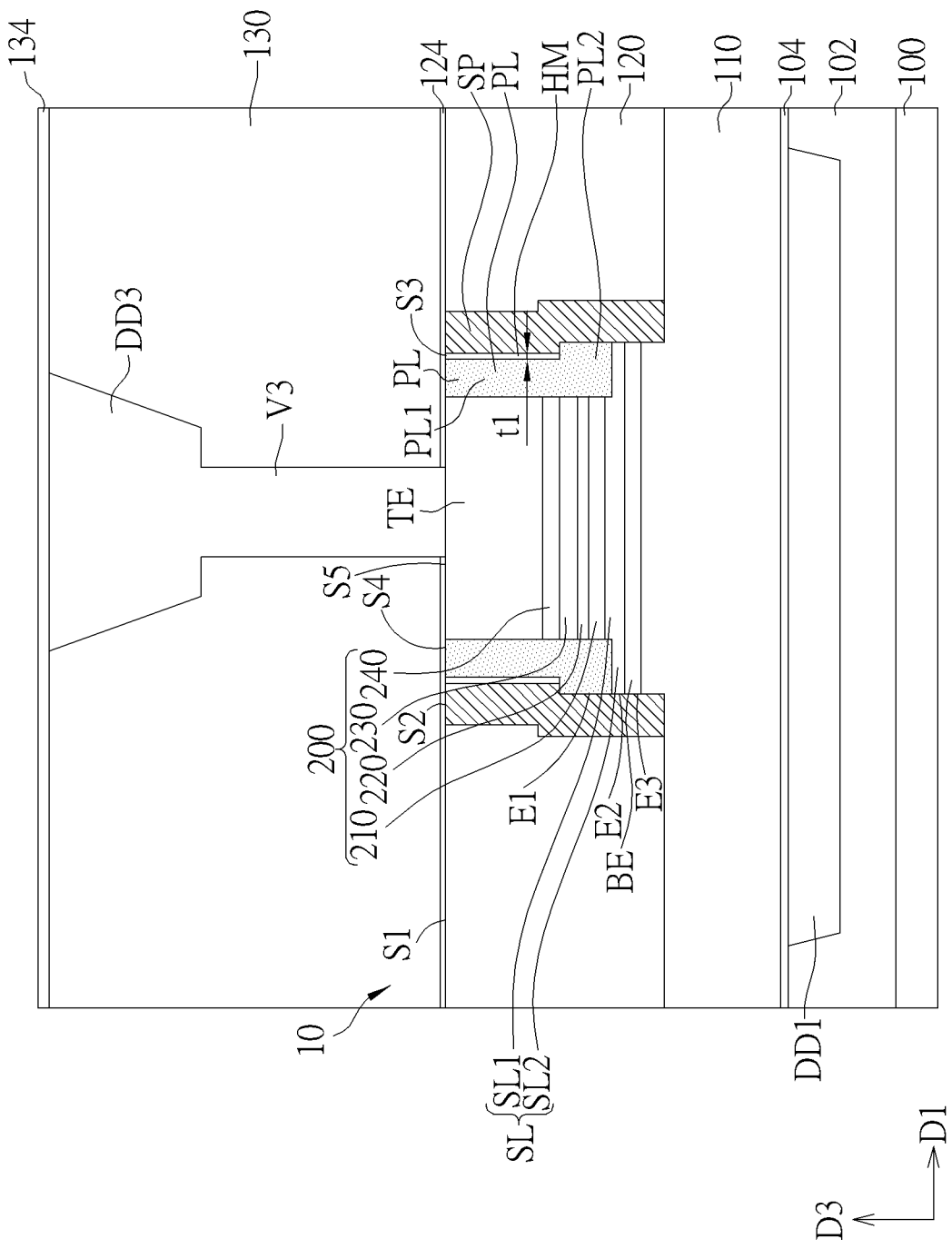
FIG. 2 is a schematic cross-sectional view taken along line I-I' shown in FIG. 1.
Figure 3:
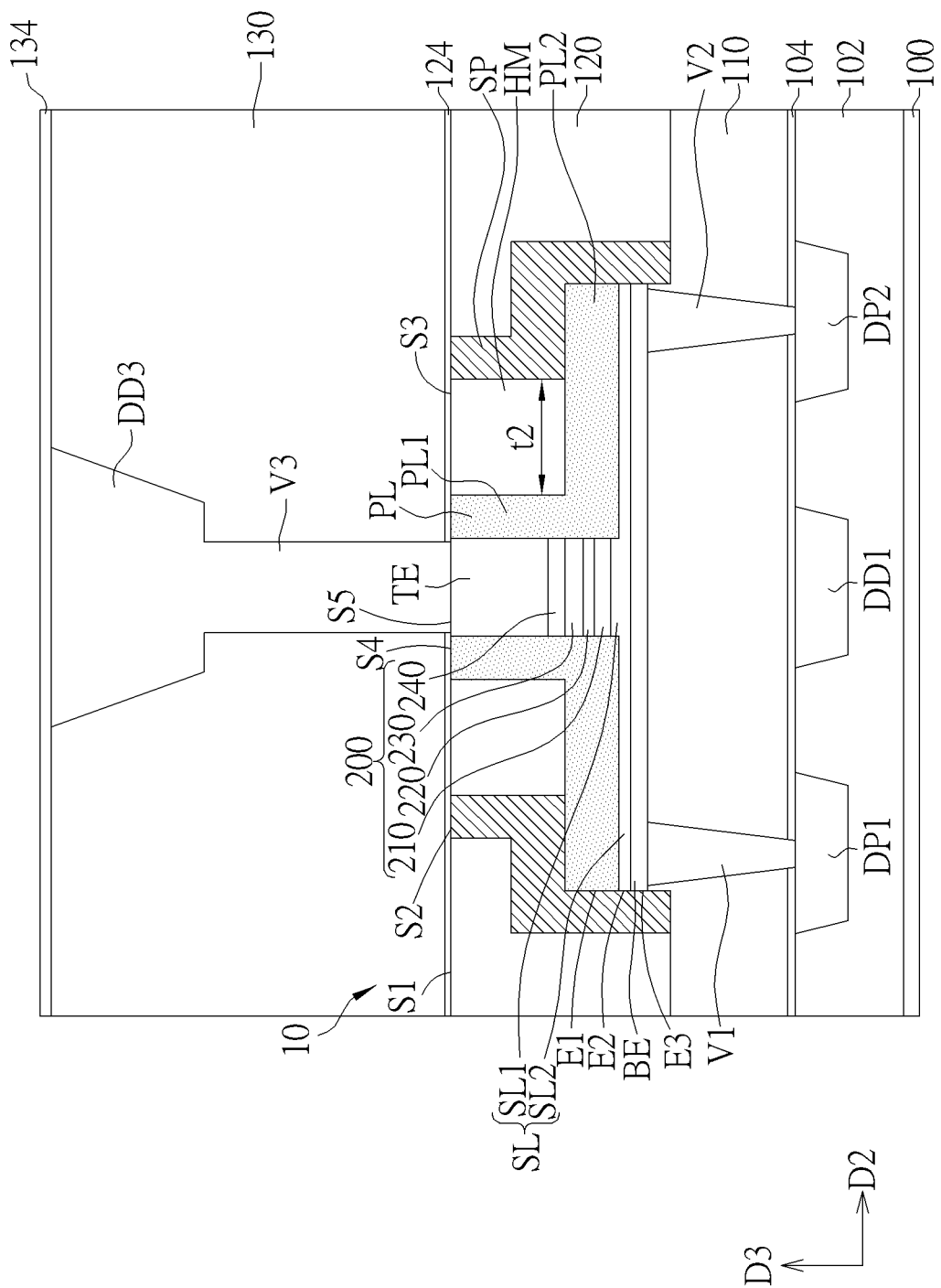
FIG. 3 is a schematic cross-sectional view taken along line II-II' shown in FIG. 1.

Please refer to FIG. 1 to FIG. 3. FIG. 1 is a top view of a magnetic random access memory (MRAM) structure according to an embodiment of the present invention. FIG. 2 is a schematic cross-sectional view taken along line I-I' shown in FIG. 1. FIG. 3 is a schematic cross-sectional view taken along line II-II' shown in FIG. 1. As shown in FIG. 1 to FIG. 3, the MRAM structure 10 comprises a substrate 100 such as, but not limited to, a silicon substrate. The MRAM structure 10 is, for example, a spin-orbit torque (SOT) MRAM. According to an embodiment of the present invention, for example, a low-k dielectric layer 102 and an interconnect structure DD1 and pad structures DP1 and DP2 formed in the low-k dielectric layer 102 are formed on the substrate 100.

According to an embodiment of the present invention, for example, the interconnect structure DD1 and the pad structures DP1 and DP2 may be copper damascene structures. According to an embodiment of the present invention, for example, the interconnect structure DD1 and the pad structures DP1 and DP2 may be located in the second metal layer (M2), but not limited thereto.

According to an embodiment of the present invention, for example, the surfaces of the interconnect structure DD1 and the pad structures DP1 and DP2 and the surface of the low-k dielectric layer 102 are covered with a barrier layer 104, such as a nitride-doped silicon carbide layer. According to an embodiment of the present invention, a dielectric layer 110, such as a tetraethoxysilane (TEOS) oxide layer, is deposited on the barrier layer 104. As shown in FIG. 3, adjacent conductive vias V1 and V2 are formed in the dielectric layer 110. According to an embodiment of the present invention, for example, the conductive vias V1 and V2 may be tungsten vias.

According to an embodiment of the present invention, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may comprise tantalum nitride (TaN), but is not limited thereto. According to an embodiment of the present invention, a spin-orbit coupling layer SL is formed on the bottom electrode layer BE. According to an embodiment of the present invention, the spin-orbit coupling layer SL comprises a tungsten layer. According to an embodiment of the present invention, the spin-orbit coupling layer SL may comprise a central portion SL1 and a peripheral portion SL2, wherein the central portion SL1 and the peripheral portion SL2 have different thicknesses. According to an embodiment of the present invention, for example, the thickness of the central portion SL1 is about 3 nm, and the thickness of the peripheral portion SL2 is smaller than that of the central portion SL1.

According to an embodiment of the present invention, a magnetic tunnel junction (MTJ) clement 200 is formed on the central portion SL1 of the spin-orbit coupling layer SL, including, but not limited to, a free layer 210 in direct contact with the spin-orbit coupling layer SL, a tunnel barrier layer 220 on the free layer 210, and a reference layer 230 on the tunnel barrier layer 220.

According to an embodiment of the present invention, the MTJ element 200 may further comprise a cap layer 240 on the reference layer 230. According to an embodiment of the present invention, the MRAM structure 10 further comprises a top electrode layer TE disposed on the MTJ element 200. According to an embodiment of the present invention, the top electrode layer TE is disposed on the cap layer 240.

According to an embodiment of the present invention, as shown in FIG. 1, the pillar structure formed by the MTJ element 200 and the top electrode layer TE, for example, has an elliptical outline when viewed from above, which is longer in the first direction D1 and shorter in the second direction D2.

According to an embodiment of the present invention, the MRAM structure 10 further comprises a nitride protective layer PL surrounding the MTJ element 200 and the top electrode layer TE. According to an embodiment of the present invention, the nitride protective layer PL may have an L-shaped profile, including a vertical portion PL1 and a horizontal portion PL2. According to an embodiment of the present invention, the vertical portion PL1 of the nitride protective layer PL protects the MTJ element 200, and the horizontal portion PL2 of the nitride protective layer PL completely masks the peripheral portion SL2 of the spin-orbit coupling layer SL. According to an embodiment of the present invention, for example, the nitride protective layer PL may comprise silicon nitride.

According to an embodiment of the present invention, the MRAM structure 10 further comprises an oxide mask layer HM surrounding the nitride protective layer PL, and a nitride spacer layer SP surrounding the oxide mask layer HM and the nitride protective layer PL. According to an embodiment of the present invention, for example, the oxide mask layer HM may comprise silicon oxide, and the nitride spacer layer SP may comprise silicon nitride. According to an embodiment of the present invention, the nitride spacer layer SP is in direct contact with the peripheral sidewall E1 of the nitride protective layer PL, the peripheral sidewall E2 of the spin-orbit coupling layer SL, and the peripheral sidewall E3 of the bottom electrode layer BE. According to an embodiment of the present invention, the peripheral sidewall E1 of the nitride protective layer PL, the peripheral sidewall E2 of the spin-orbit coupling layer SL, and the peripheral sidewall E3 of the bottom electrode layer BE are aligned in the third direction D3. According to an embodiment of the present invention, the above-mentioned first direction D1, second direction D2 and third direction D3 may be mutually orthogonal. According to an embodiment of the present invention, the nitride spacer layer SP is in direct contact with the dielectric layer 110.

According to an embodiment of the present invention, the oxide mask layer HM is sandwiched between the nitride protective layer PL and the nitride spacer layer SP, and has different thicknesses. According to an embodiment of the present invention, for example, in the first direction D1, the oxide mask layer HM has a first thickness t1, and in the second direction D2, the oxide mask layer HM has a second thickness t2, wherein the first A thickness t1 is different from a second thickness t2. According to an embodiment of the present invention, for example, the first thickness t1 is smaller than the second thickness t2. According to an embodiment of the present invention, for example, the first thickness t1 may be equal to zero.

According to an embodiment of the present invention, the MRAM structure 10 may further comprise a dielectric layer 120, such as a silicon oxide layer, surrounding the nitride spacer layer SP. According to an embodiment of the present invention, the top surface S1 of the dielectric layer 120, the top surface S2 of the nitride spacer layer SP, the top surface S3 of the oxide mask layer HM, the top surface S4 of the nitride protective layer PL, and the top surface S5 of the top electrode layer TE are coplanar.

According to an embodiment of the present invention, the MRAM structure 10 may further comprise a barrier layer 124 covering the top surface S1 of the dielectric layer 120, the top surface S2 of the nitride spacer layer SP, and the top surface S3 of the oxide mask layer HM, the top surface S4 of the nitride protective layer PL, and the top surface S5 of the top electrode layer TE. According to an embodiment of the present invention, the MRAM structure 10 may further comprise a low-k dielectric layer 130 covering the barrier layer 124.

According to an embodiment of the present invention, the MRAM structure 10 may further comprise an interconnect structure DD3 and a conductive via V3. According to an embodiment of the present invention, for example, the interconnect structure DD3 and the conductive via V3 may be a copper dual damascene structure. According to an embodiment of the present invention, for example, the interconnect structure DD3 may be located in the fourth metal layer (M4), but is not limited thereto. According to an embodiment of the present invention, the interconnect structure DD3 is electrically connected to the top electrode layer TE through the conductive via V3. The MRAM structure 10 may further comprise a barrier layer 134 covering the low-k dielectric layer 130 and the interconnect structure DD3.

Figure 4:
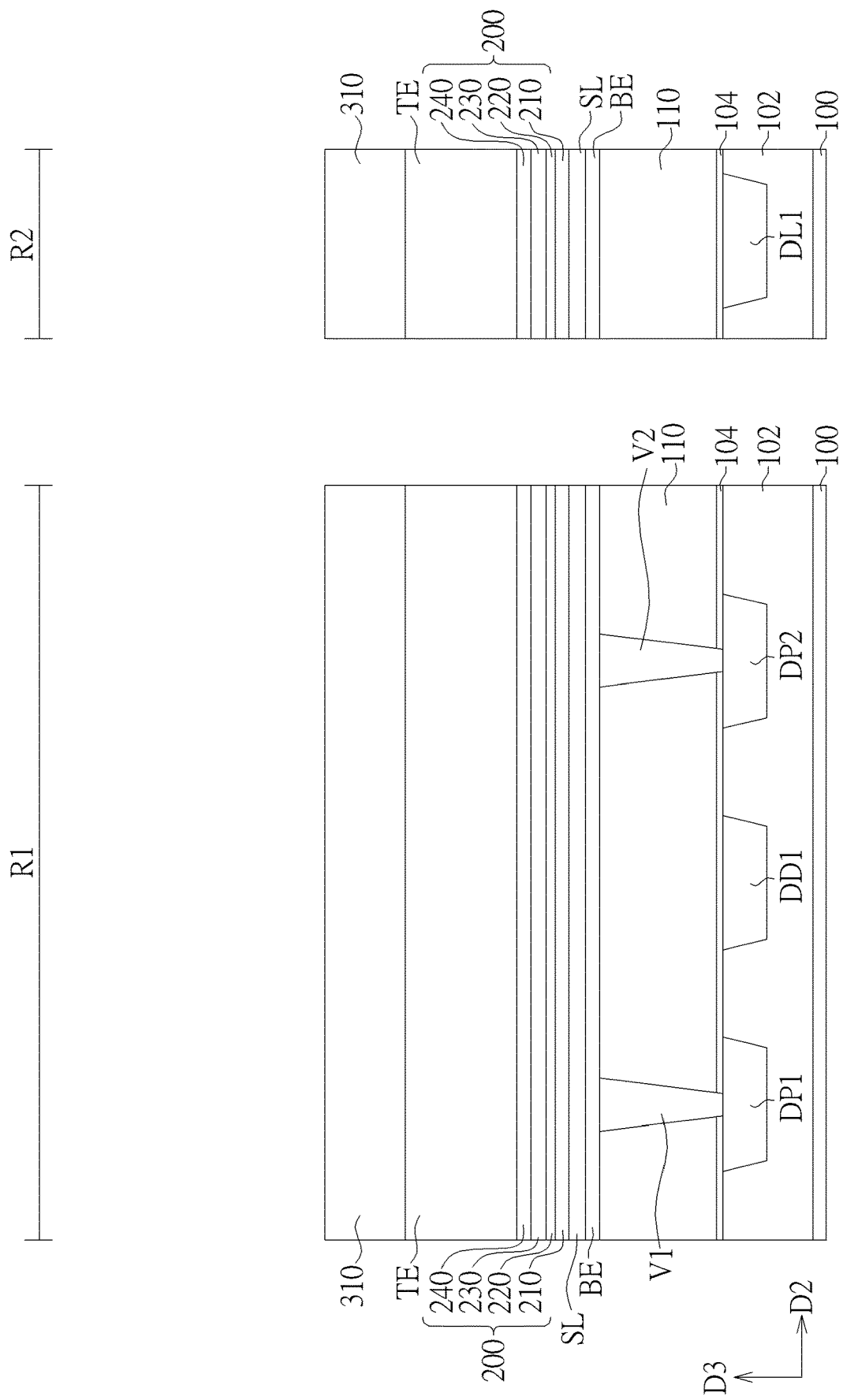
FIG. 4 to FIG. 14 are schematic diagrams of the manufacturing method of the magnetic random access memory structure according to the embodiment of the present invention.

Please refer to FIG. 4 to FIG. 14, which are schematic diagrams of the manufacturing method of the magnetic random access memory structure according to the embodiment of the present invention. As shown in FIG. 4, firstly, a substrate 100 is provided, such as a silicon substrate, on which a memory region R1 and a logic circuit region R2 are provided. According to an embodiment of the present invention, for example, a low-k dielectric layer 102 is formed in the memory region R1 and the logic circuit region R2 on the substrate 100. For example, an interconnect structure DD1 and pad structures DP1 and DP2 are formed in the low-k dielectric layer 102 in the memory region R1. For example, an interconnect structure DL1 is formed in the low-k dielectric layer 102 in the logic circuit region R2. According to an embodiment of the present invention, for example, the interconnect structure DD1 and the pad structures DP1 and DP2 may be copper damascene structures. According to an embodiment of the present invention, for example, the interconnect structure DL1, the interconnect structure DD1 and the pad structures DP1 and DP2 may be located in the second metal layer (M2), but not limited thereto.

According to an embodiment of the present invention, for example, the surfaces of the interconnect structure DD1 and the pad structures DP1 and DP2 and the surface of the low-k dielectric layer 102 are covered with a barrier layer 104, such as a nitride-doped silicon carbide layer. According to an embodiment of the present invention, a dielectric layer 110 is deposited on the barrier layer 104, such as a tetracthoxysilane (TEOS) oxide layer. Adjacent conductive vias V1 and V2 are formed in the dielectric layer 110 in the memory region R1. According to an embodiment of the present invention, for example, the conductive vias V1 and V2 may be tungsten vias.

Subsequently, a bottom electrode layer BE is formed on the dielectric layer 110. According to an embodiment of the present invention, the bottom electrode layer BE is electrically connected to the conductive via V1 and the conductive via V2. According to an embodiment of the present invention, for example, the bottom electrode layer BE may comprise tantalum nitride (TaN), but is not limited thereto. Next, a spin-orbit coupling layer SL is formed on the bottom electrode layer BE. According to an embodiment of the present invention, the spin-orbit coupling layer SL comprises a tungsten layer. A free layer 210, a tunnel barrier layer 220, a reference layer 230, a cap layer 240, a top electrode layer TE and an oxide mask layer 310 are sequentially formed.

Figure 5:
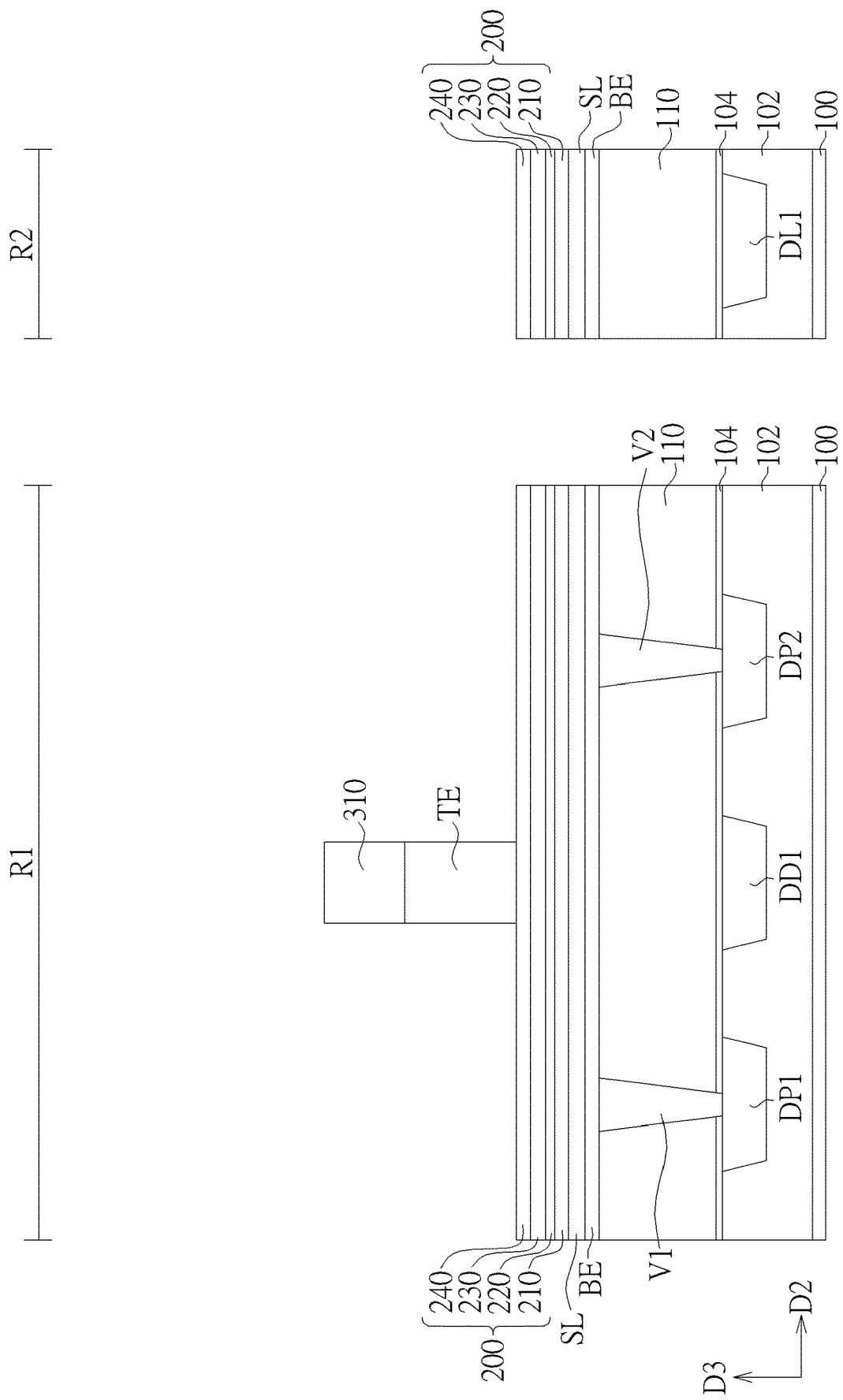

As shown in FIG. 5, lithography and etching processes are then performed, and the top electrode layer TE is patterned by using the oxide mask layer 310 as an etch stop layer. The above-mentioned lithography and etching processes are well-known techniques, so the details thereof will not be repeated here. For example, the lithography process may comprise steps such as photoresist coating, baking, exposure, and development, and the etching process may be an anisotropic plasma dry etching process or a reactive ion etching (RIE) process. At this point, the top electrode layer TE in the logic circuit region R2 is completely removed.

Figure 6:
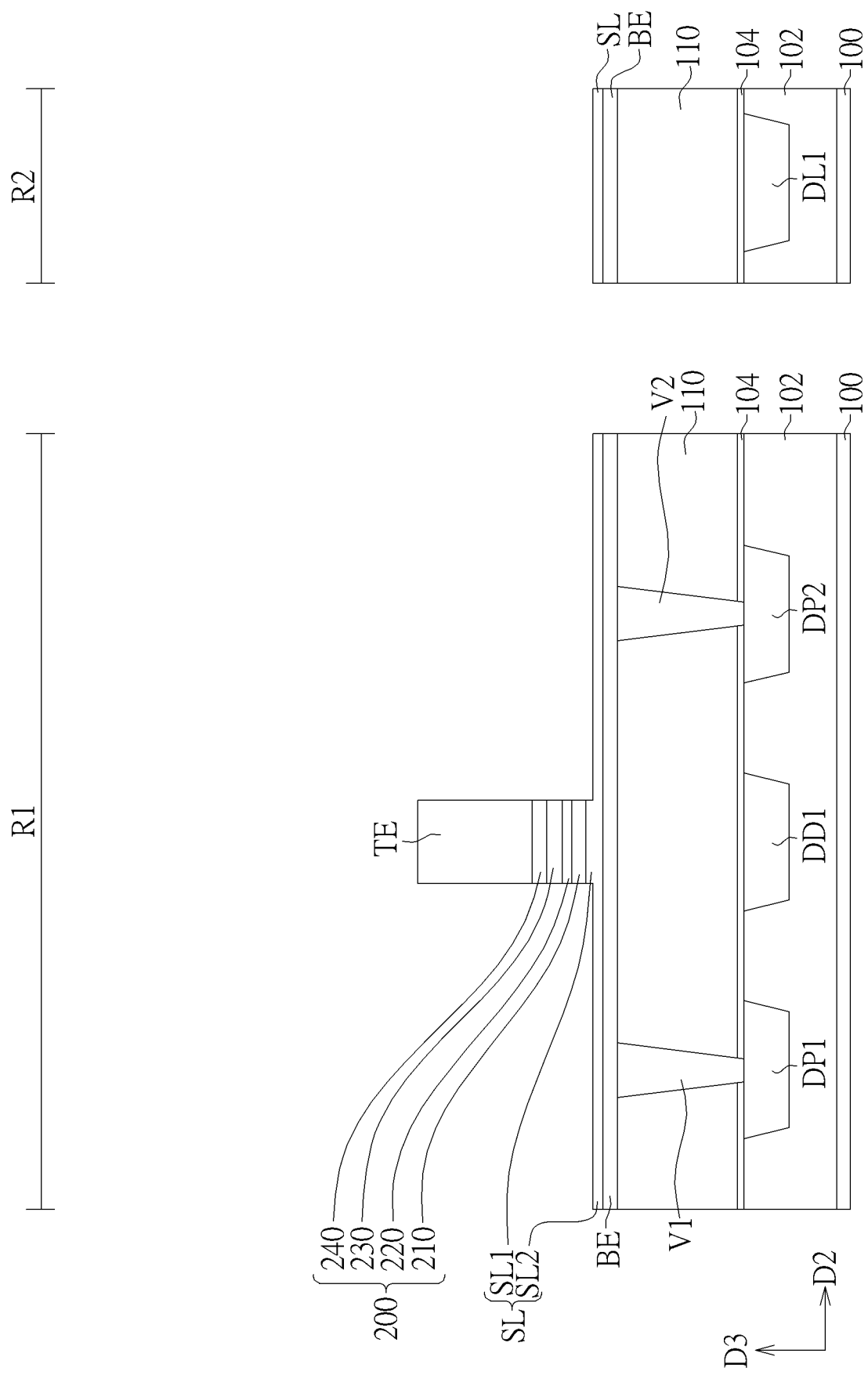

As shown in FIG. 6, after the patterning of the top electrode layer TE is completed, the patterning steps of the free layer 210, the tunnel barrier layer 220, the reference layer 230, and the cap layer 240 can be continued. For example, the free layer 210, the tunnel barrier layer 220, the reference layer 230 and the cap layer 240 not covered by the top electrode layer TE may be etched by an anisotropic plasma dry etching process to form the MTJ element 200. At this point, the free layer 210, the tunnel barrier layer 220, the reference layer 230 and the cap layer 240 in the logic circuit region R2 are completely removed, leaving a partial thickness of the spin-orbit coupling layer SL.

Figure 7:
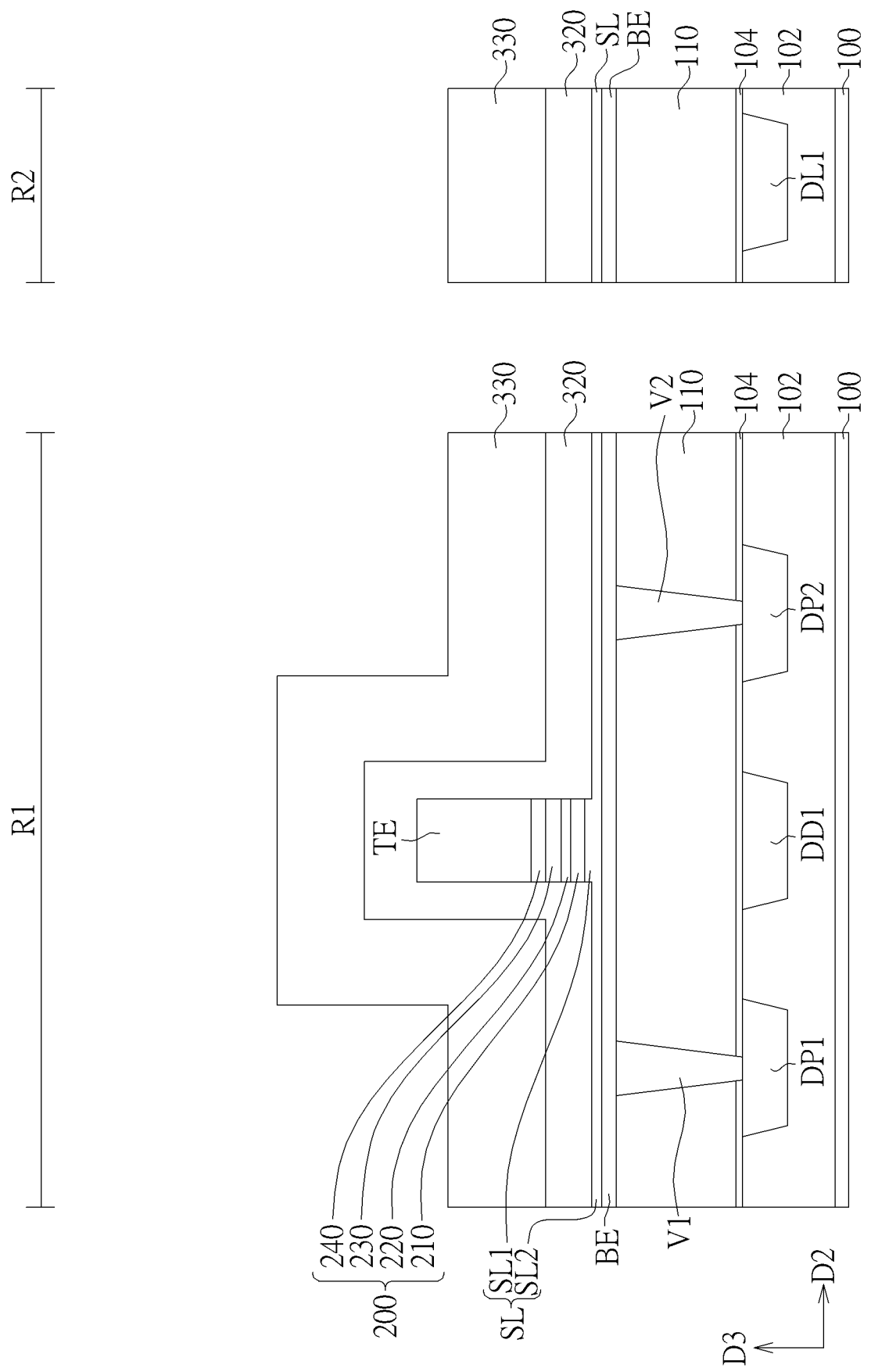

As shown in FIG. 7, subsequently, a chemical vapor deposition (CVD) process is performed, and a silicon nitride layer 320 is conformally deposited on the substrate 100, so that the silicon nitride layer 320 covers the sidewall of the MTJ element 200 and the sidewall and top surface of the top electrode layer TE. According to an embodiment of the present invention, before depositing the silicon nitride layer 320, an in-situ oxidation process may be optionally performed to form an oxide layer (not shown) on the sidewall of the MTJ element 200 to protect the MTJ element 200. Next, another CVD process is performed to conformally deposit a silicon oxide layer 330 on the silicon nitride layer 320.

Figure 8:
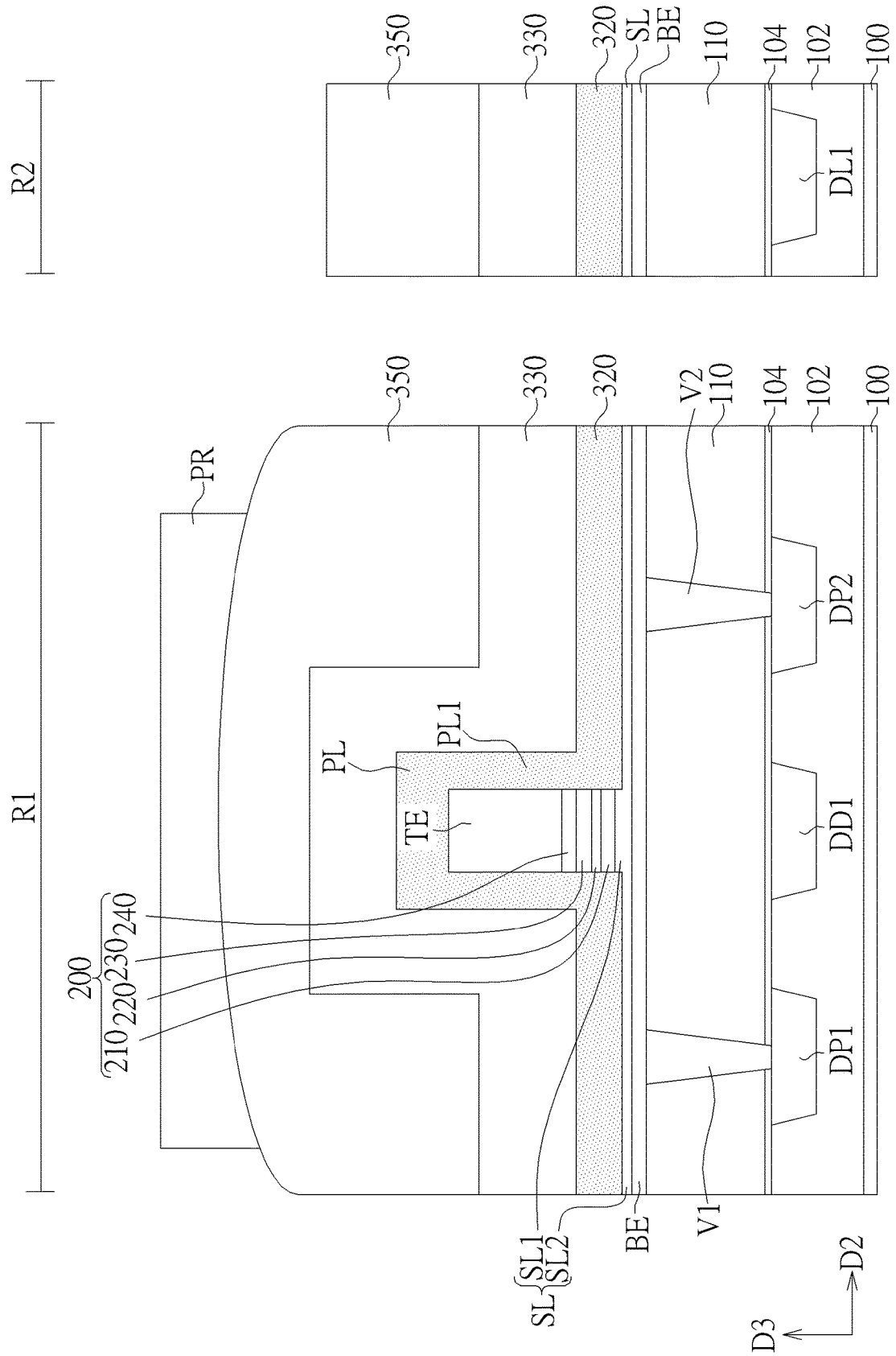

As shown in FIG. 8, the silicon oxide layer 330 is then completely covered with the anti-reflection layer 350, and then a photoresist pattern PR is formed on the anti-reflection layer 350 in the memory region R1, wherein the photoresist pattern PR defines pattern of the spin-orbit coupling layer SL.

Figure 9:
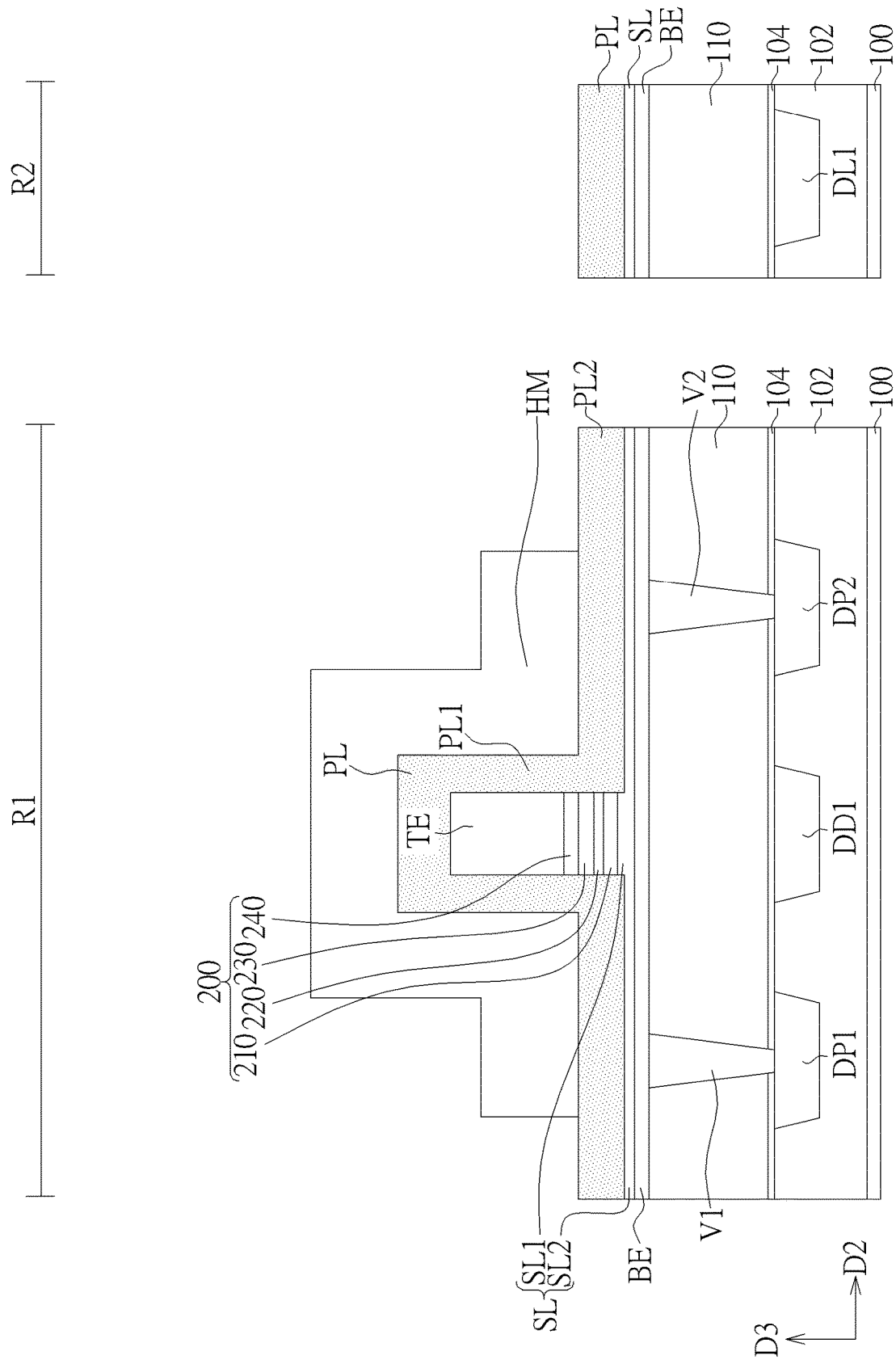

As shown in FIG. 9, a dry etching process, for example, an anisotropic plasma dry etching process or a reactive ion etching (RIE) process is then performed to etch away the anti-reflection layer 350 and the silicon oxide layer 330 not covered by the photoresist pattern PR, thereby forming an oxide mask layer HM. The remaining photoresist pattern PR and anti-reflection layer 350 are then removed. At this point, the silicon nitride layer 320 in the logic circuit region R2 is exposed.

Figure 10:
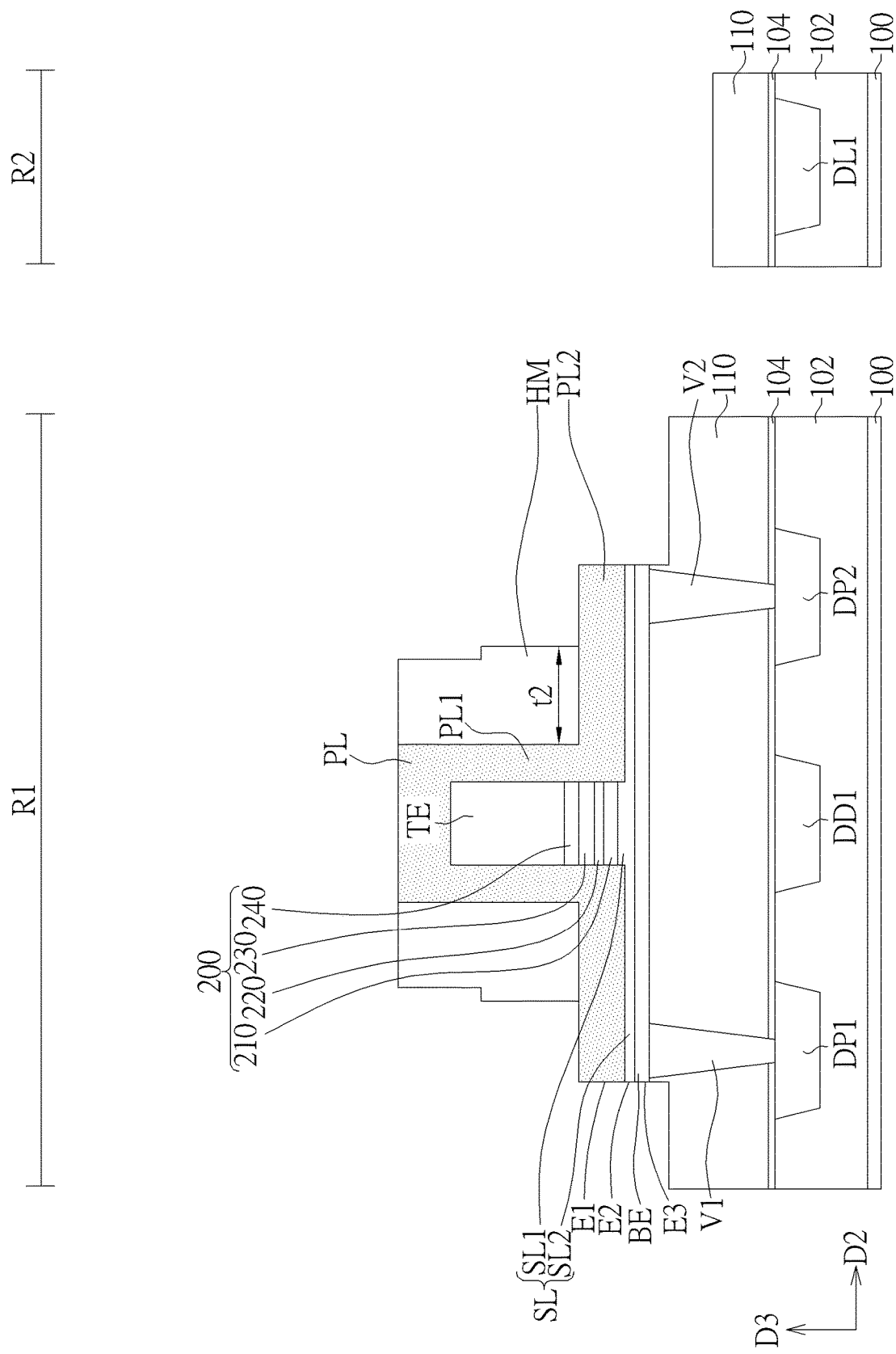

As shown in FIG. 10, a small-angle ion beam etching (IBE) process is performed to remove part of the oxide mask layer HM, and the silicon nitride layer 320, the spin-orbit coupling layer SL and the bottom electrode layer BE not covered by the oxide mask layer HM, until the dielectric layer 110 is exposed, thereby forming a nitride protective layer PL. According to an embodiment of the present invention, the spin-orbit coupling layer SL may comprise a central portion SL1 and a peripheral portion SL2, wherein the central portion SL1 and the peripheral portion SL2 have different thicknesses. According to an embodiment of the present invention, for example, the thickness of the central portion SL1 is about 3 nm, and the thickness of the peripheral portion SL2 is smaller than that of the central portion SL1.

Figure 11:
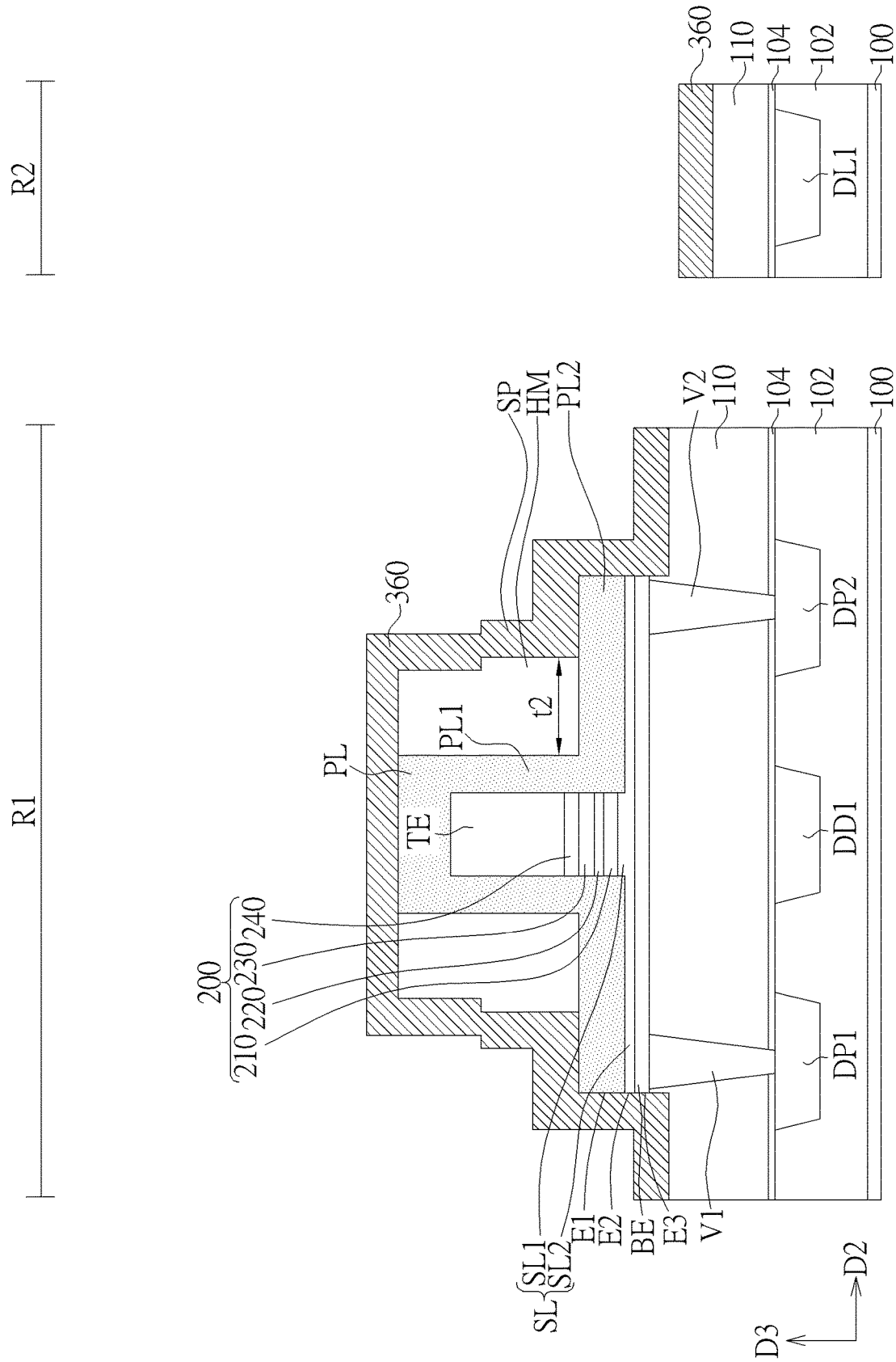

As shown in FIG. 11, a CVD process is then performed to conformally deposit a silicon nitride layer 360 on the substrate 100. According to an embodiment of the present invention, the silicon nitride layer 360 is in direct contact with the peripheral sidewall E1 of the nitride protective layer PL, the peripheral sidewall E2 of the spin-orbit coupling layer SL, and the peripheral sidewall E3 of the bottom electrode layer BE.

Figure 12:
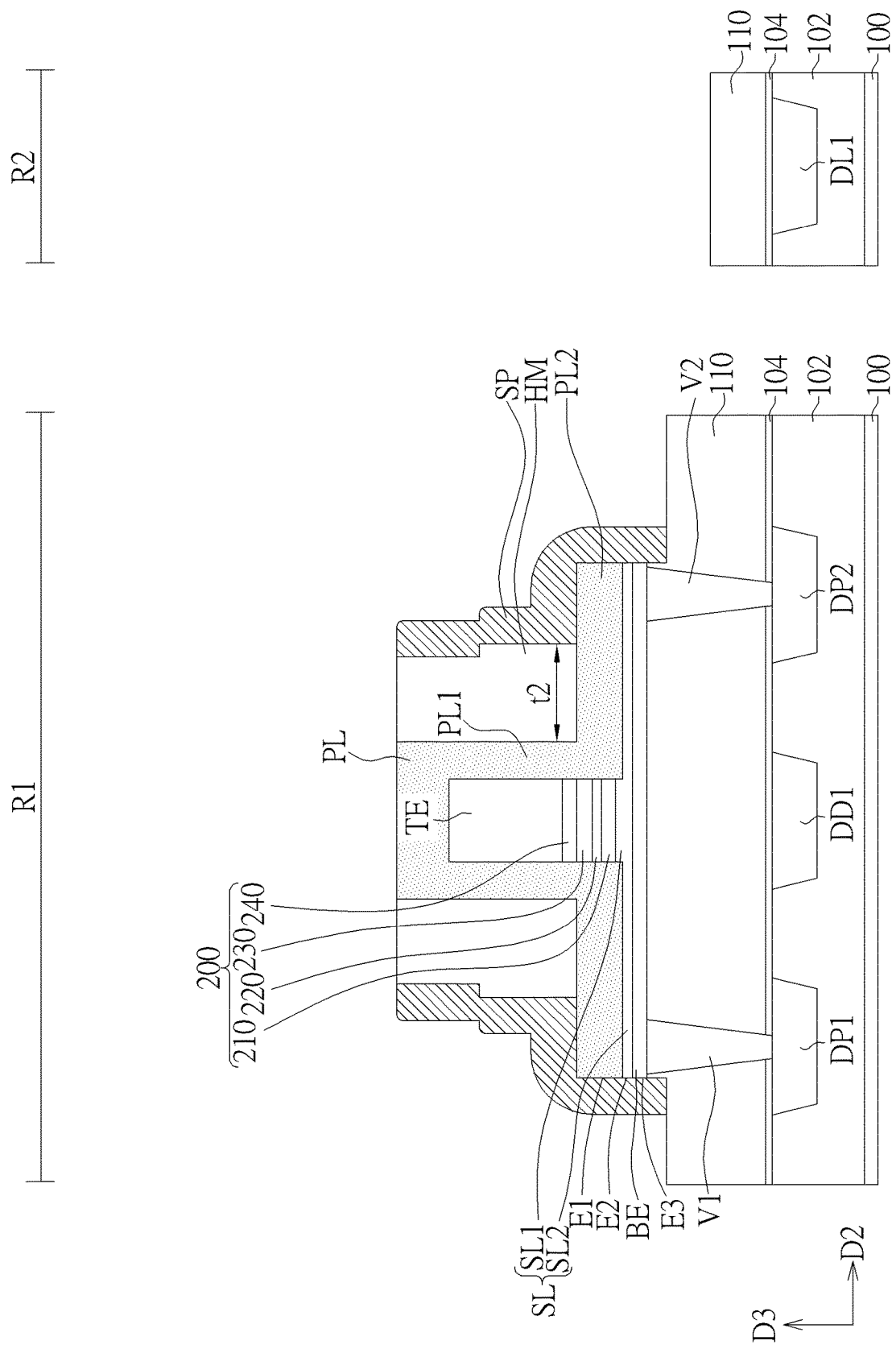

As shown in FIG. 12, an etch-back process, such as an anisotropic plasma dry etching process, is performed to etch the silicon nitride layer 360 to form a nitride spacer layer SP around the oxide mask layer HM and the nitride protective layer PL.

Figure 13:
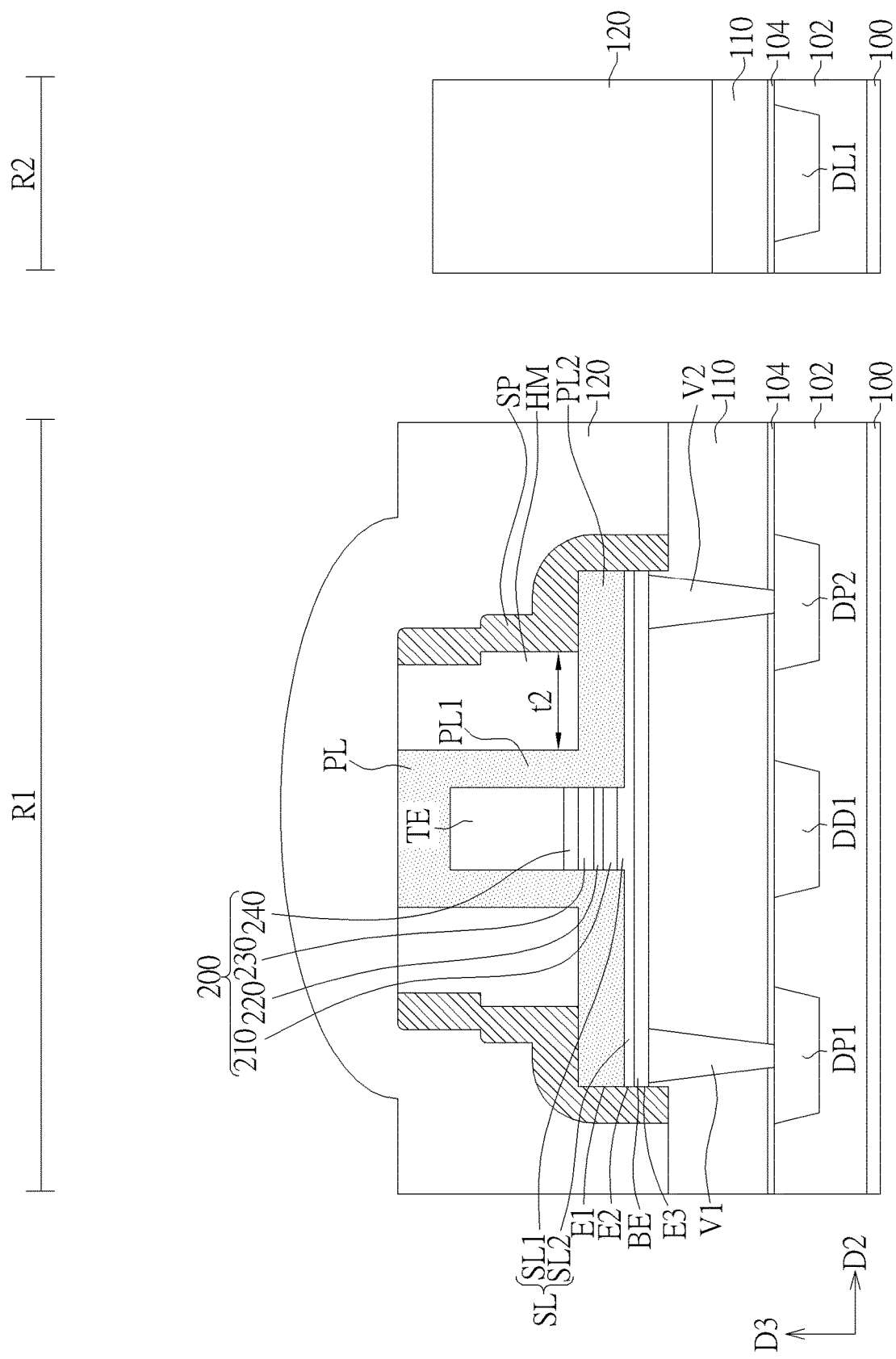

As shown in FIG. 13, a CVD process is then performed to deposit a dielectric layer 120, for example, a silicon oxide layer, on the substrate 100 in a blanket manner. According to an embodiment of the present invention, the dielectric layer 120 surrounds the nitride spacer layer SP and covers top surfaces of the oxide mask layer HM and the nitride protective layer PL. In the logic circuit region R2, the dielectric layer 120 is in direct contact with the dielectric layer 110.

Figure 14:
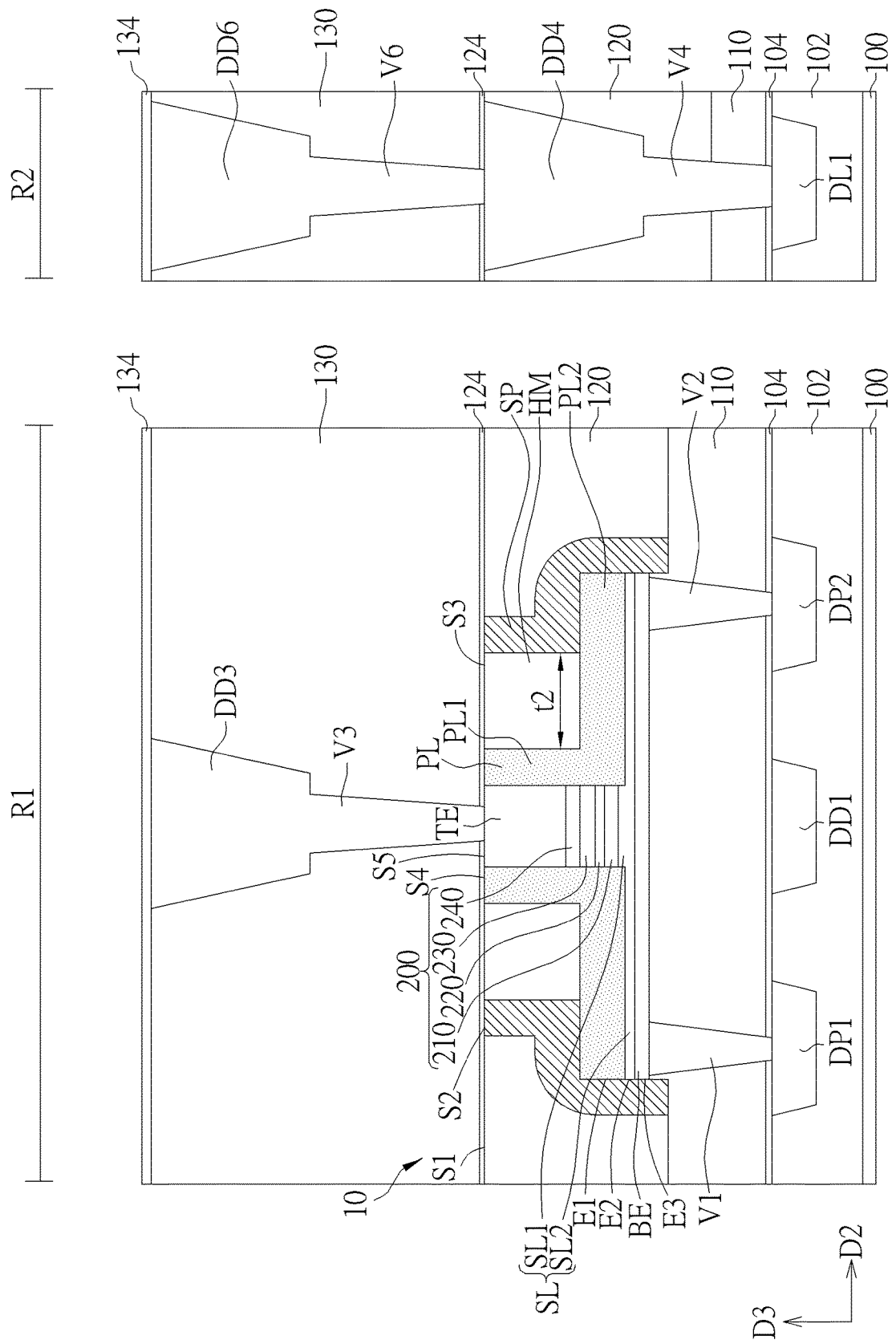

As shown in FIG. 14, a chemical mechanical polishing (CMP) process is then performed to planarize the dielectric layer 120, and polish off part of the nitride protective layer PL, the oxide mask layer HM, the nitride spacer layer SP and the top electrode layer TE. According to an embodiment of the present invention, the top surface S1 of the dielectric layer 120, the top surface S2 of the nitride spacer layer SP, the top surface S3 of the oxide mask layer HM, the top surface S4 of the nitride protective layer PL, and the top surface S5 of the top electrode layer TE are coplanar.

Subsequently, the metallization process in the logic circuit region R2 is performed to form the interconnect structure DD4 and the conductive via V4. According to an embodiment of the present invention, for example, the interconnect structure DD4 and the conductive via V4 may be a copper dual damascene structure. According to an embodiment of the present invention, for example, the interconnect structure DD4 may be located in the third metal layer (M3), but is not limited thereto.

A barrier layer 124 is then formed to cover the top surface S1 of the dielectric layer 120, the top surface S2 of the nitride spacer layer SP, the top surface S3 of the oxide mask layer HM, the top surface S4 of the nitride protective layer PL, and the top surface S5 of the electrode layer TE. A low-k dielectric layer 130 may be formed on the barrier layer 124.

A metallization process is then performed in the memory region R1 and the logic circuit region R2 to form interconnect structures DD3 and DD6 and conductive vias V3 and V6 respectively. According to an embodiment of the present invention, for example, the interconnect structures DD3 and DD6 and the conductive vias V3 and V6 may be copper dual damascene structures. According to an embodiment of the present invention, for example, the interconnect structures DD3 and DD6 may be located in the fourth metal layer (M4), but not limited thereto. According to an embodiment of the present invention, the interconnect structure DD3 is electrically connected to the top electrode layer TE through the conductive via V3. Next, a barrier layer 134 may be formed to cover the low-k dielectric layer 130 and the interconnect structures DD3 and DD6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic random access memory structure, comprising:
   a substrate;
   a first dielectric layer disposed on the substrate;
   a first conductive via and a second conductive via in proximity to the first conductive via embedded in the first dielectric layer;
   a bottom electrode layer disposed on the first dielectric layer, wherein the bottom electrode layer electrically connects the first conductive via with the second conductive via;
   a spin orbit coupling layer disposed on the bottom electrode layer;
   a magnetic tunneling junction (MTJ) element disposed on the spin orbit coupling layer;
   a top electrode layer disposed on the MTJ element;

a nitride protective layer surrounding the MTJ element and the top electrode layer, and the nitride protective layer masking the spin orbit coupling layer;

an oxide mask layer surrounding the nitride protective layer;

a nitride spacer layer surrounding the oxide mask layer and the nitride protective layer; and a second dielectric layer surrounding the nitride spacer layer.

2. The magnetic random access memory structure according to claim 1, wherein the MTJ element comprises a free layer in direct contact with the spin orbit coupling layer, a tunnel barrier layer on the free layer, and a reference layer on the tunnel barrier layer.

3. The magnetic random access memory structure according to claim 2, wherein the MTJ element further comprises a cap layer on the reference layer, wherein the top electrode layer is disposed on the cap layer.

4. The magnetic random access memory structure according to claim 1, wherein the oxide mask layer between the nitride protective layer and the nitride spacer layer has a first thickness in a first direction and a second thickness in a second direction, wherein the first thickness is different from the second thickness.

5. The magnetic random access memory structure according to claim 1, wherein the nitride protective layer comprises silicon nitride, the oxide mask layer comprises silicon oxide, and the nitride spacer layer comprises silicon nitride.

6. The magnetic random access memory structure according to claim 1, wherein the nitride spacer layer is in direct contact with a peripheral sidewall of the nitride protective layer, a peripheral sidewall of the spin orbit coupling layer, and a peripheral sidewall of the bottom electrode layer.

7. The magnetic random access memory structure according to claim 1, wherein the nitride spacer layer is in direct contact with the first dielectric layer.

8. The magnetic random access memory structure according to claim 1, wherein a top surface of the second dielectric layer is coplanar with a top surface of the nitride spacer layer, a top surface of the oxide mask layer, a top surface of the nitride protective layer, and a top surface of the top electrode layer.

9. The magnetic random access memory structure according to claim 1, wherein the spin orbit coupling layer comprises a tungsten layer.

10. A magnetic random access memory structure, comprising:
a first dielectric layer;
a bottom electrode layer disposed on the first dielectric layer;
a spin orbit coupling layer disposed on the bottom electrode layer;
a magnetic tunneling junction (MTJ) element disposed on the spin orbit coupling layer;
a top electrode layer disposed on the MTJ element;
a protective layer surrounding the MTJ element and the top electrode layer, and the protective layer masking the spin orbit coupling layer;
a mask layer surrounding the protective layer;
a spacer layer surrounding the mask layer and the protective layer; and
a second dielectric layer surrounding the spacer layer.

11. The magnetic random access memory structure according to claim 10, wherein the MTJ element comprises a free layer in direct contact with the spin orbit coupling layer, a tunnel barrier layer on the free layer, and a reference layer on the tunnel barrier layer.

12. The magnetic random access memory structure according to claim 11, wherein the MTJ element further comprises a cap layer on the reference layer, wherein the top electrode layer is disposed on the cap layer.

13. The magnetic random access memory structure according to claim 10, wherein the mask layer between the protective layer and the spacer layer has a first thickness in a first direction and a second thickness in a second direction, wherein the first thickness is different from the second thickness.

14. The magnetic random access memory structure according to claim 10, wherein the protective layer comprises silicon nitride, the mask layer comprises silicon oxide, and the spacer layer comprises silicon nitride.

15. The magnetic random access memory structure according to claim 10, wherein the spacer layer is in direct contact with a peripheral sidewall of the protective layer, a peripheral sidewall of the spin orbit coupling layer, and a peripheral sidewall of the bottom electrode layer.

16. The magnetic random access memory structure according to claim 10, wherein the spacer layer is in direct contact with the first dielectric layer.

17. The magnetic random access memory structure according to claim 10, wherein a top surface of the second dielectric layer is coplanar with a top surface of the spacer layer, a top surface of the mask layer, a top surface of the protective layer, and a top surface of the top electrode layer.

18. The magnetic random access memory structure according to claim 10, wherein the spin orbit coupling layer comprises a tungsten layer.

* * * * *